United States Patent [19]

Dresser et al.

[11] 3,728,718

[45] Apr. 17, 1973

[54] SERVO SYSTEM HAVING HIGH RESOLUTION D/A

[75] Inventors: Allan W. Dresser, Newington; Johann F. Reuteler, Elmwood, both of Conn.

[73] Assignee: Colt Industries Operating Corp., New York, N.Y.

[22] Filed: Jan. 18, 1972

[21] Appl. No.: 218,745

[52] U.S. Cl. ............................340/347 DA, 235/154

[51] Int. Cl. ............................................H03k 13/02

[58] Field of Search ...............................340/347 DA; 235/92 CC, 154, 92 PL

[56] References Cited

UNITED STATES PATENTS

| | | | |
|---|---|---|---|
| 3,585,630 | 6/1971 | Pomella | 235/154 |
| 3,587,066 | 5/1971 | Maure | 235/92 PE |
| 3,582,624 | 6/1971 | Gantschnig | 235/92 PE |

*Primary Examiner*—Maynard R. Wilbur
*Assistant Examiner*—Jeremiah Glassman
*Attorney*—Radford W. Luther et al.

[57] ABSTRACT

A numerical control system for moving a controlled member along a given axis includes a digital to analog converter and a logic circuit to increase the resolution of the digital to analog converter. The logic circuit subdivides adjacent counts retained in the logic circuit by varying the amount of time during which the respective counts are directed to the digital to analog converter. The counts retained in the logic circuit differ by a fixed amount, and the magnitude of these counts is dependent upon the input pulse frequency applied to the logic circuit.

4 Claims, 7 Drawing Figures

SERVO SYSTEM HAVING HIGH RESOLUTION D/A

BACKGROUND OF THE INVENTION

This invention relates to numerical control systems, and more particularly to numerical control systems for machine tools. The invention also relates to digital to analog converters.

Numerous systems, such as numerical control systems for machine tools, utilize digital to analog converters to transform a signal in digital form to an analog signal. The resolution obtainable in the conversion process is normally dependent upon the bit capacity of the digital to analog converter. In situations where high resolution is mandated, a digital to analog converter having a high bit capacity is typically utilized. A prominent drawback inherent in such an approach is that an increased bit capacity digital to analog converter increases system expense since more hardware, including items such as storage latches, counters, is required. In addition, this also results in a penalty to the reliability of the overall system. It would, therefore, be highly desirable to provide an arrangement for increasing the resolution of a digital to analog converter without necessitating an increase in the bit capacity thereof.

SUMMARY OF THE INVENTION

The invention provides a high resolution digital to analog converter which incorporates a digital to analog converter of lesser resolution. The high resolution digital to analog converter of the invention is particularly well-suited to applications involving numerical control systems for machine tools.

Succinctly stated, a digital to analog converter is coupled to a logic circuit which receives, as its input, a digital signal. The output of the logic circuit, which is a digital signal directed to the digital to analog converter, is a function of the frequency of digital signal input to the logic circuit. The logic circuit includes a counter and two storage devices. The count in the counter, which is dependent upon the digital input signal to the logic circuit, is periodically sampled and placed in the storage device which has as its output the digital signal to the digital to analog converter. The other storage device contains a number constituted by the fixed number in the first storage device plus a fixed number. The logic circuit embodies an arrangement whereby, in accordance with the digital signal input to the logic circuit, the contents of the storage devices are selectively directed to the digital to analog converter such that during a sampling period the contents of one of the storage devices is applied to the digital to analog converter for a longer period of time than the contents of the other storage device, this time variation being determined by the pulse frequency of the digital input signal to the logic circuit. Therefore, during the sampling period, the average analog output signal will be dependent upon the length of the sampling period during which the contents of the first storage device are applied to the digital to analog converter, the contents in the other storage device being applied to the digital to analog converter during the remainder of the sampling period.

A high resolution digital to analog converter in accordance with the invention thereby provides the resolution of a high bit capacity digital to analog converter without encountering the aforementioned difficulties.

Accordingly, it is a primary object of the invention to provide a high resolution digital to analog converter which has a resolution higher than that furnished by the bit capacity of the digital to analog converter which it incorporates.

It is another object of the invention to provide a high resolution digital to analog converter for a numerical control system adapted to be utilized in conjunction with a machine tool.

These and other objects and advantages will become more readily apparent from the following detailed description taken in conjunction with the accompanying drawings.

BRIEF DESCRIPTION OF THE DRAWINGS

FIG. 4 B is a logic diagram of the remaining portion of the high resolution digital to analog converter of FIG. 1.

DETAILED DESCRIPTION OF PREFERRED EMBODIMENT

Figure 1:
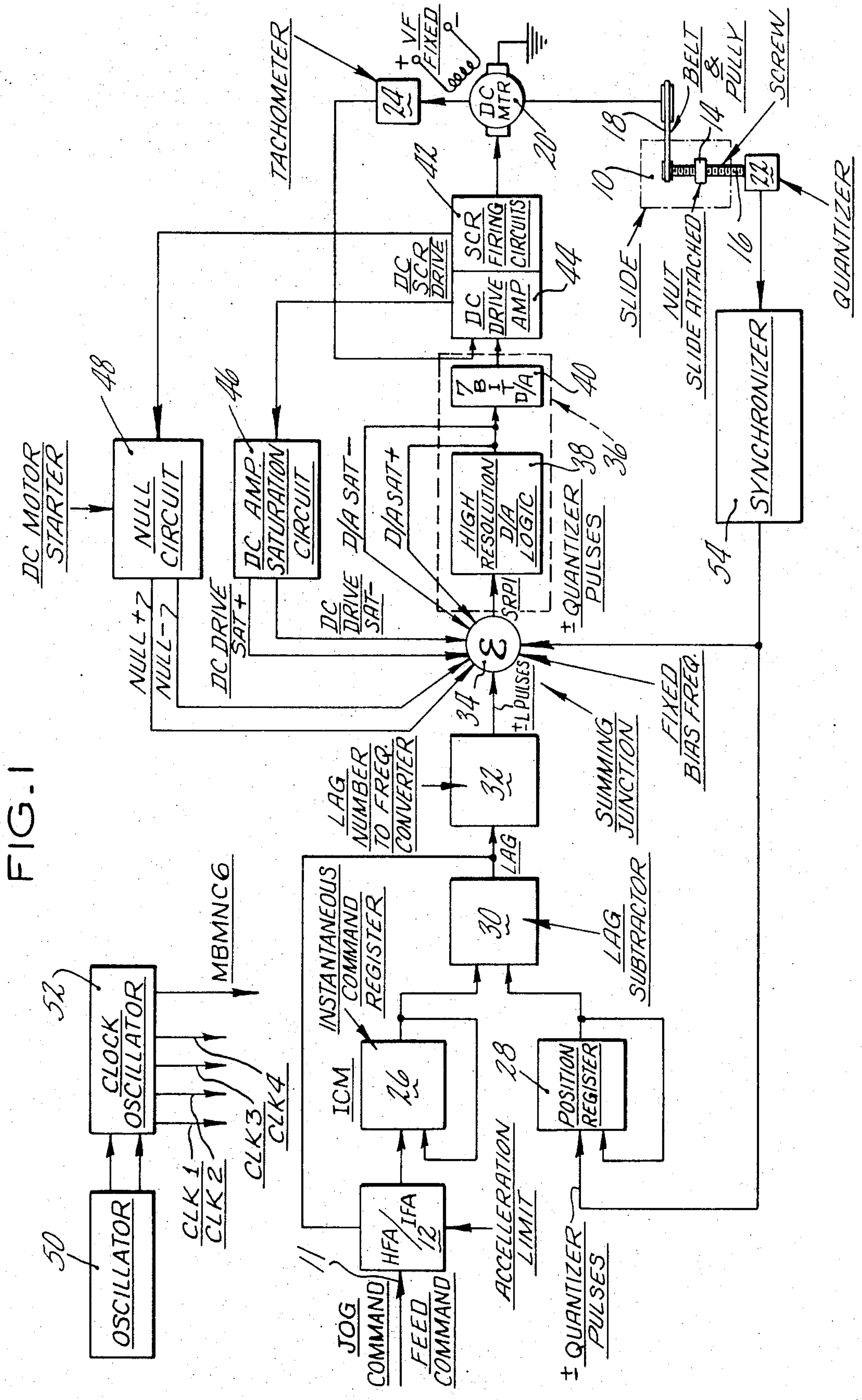
FIG. 1 is a block diagram of a servo system for a machine tool incorporating a high resolution digital to analog converter in accordance with the invention.

Referring to FIG. 1, wherein there is shown a servo block diagram for an axis of a numerically controlled machine tool, such as a jig borer, a controlled member 10, shown in the form of a slide, is positioned by a command signal 11. A nut 14 is fixedly secured to the slide 10 and has its threaded interior in engagement with a drive screw 16. Rotation of the drive screw 16, which is engendered by a belt and pulley arrangement 18, imparts motion to the slide 10 in accordance with the direction and speed of rotation of a DC motor 20. Connected to the drive screw 16 is a quantizer 22.

The output of quantizer 22 is a pulse frequency proportional to the velocity of slide 10. The quantizer 22 generates a pulse which may be positive or negative in accordance with the direction of movement of the slide 10 whenever the slide 10 moves $1 \times 10^{-4}$ inches. The quantizer 22 may, in a preferred form, be constituted by a shaft encoder (not shown) mechanically connected to the drive screw 16 and adapted to furnish output wave forms, each of which comprises a number of pulses indicative of the rate of rotation of drive screw 16 and so related in phase as to indicate the direction of rotation thereof. The output wave forms of the shaft may be applied to pulse shaping networks such as Schmidt trigger circuits which have outputs which are applied to a decoding network (not shown) adapted to sense the direction of rotation of the drive screw and provide a pulse frequency output over either a positive or a negative line. A suitable quantizer is shown and described in detail in U.S. Pat. No. 3,443,178. It will be noted that an integration of the pulse frequency output of quantizer 22 represents the actual position of slide 10 with respect to a reference point, and that the instantaneous pulse frequency output of the quantizer represents the velocity of the slide 10. A tachometer 24 is directly coupled to the shaft of the DC motor 20 for generating a voltage proportional to the speed of motor 20. It will be appreciated that the tachometer 24 generates an analog feedback signal, whereas the quantizer 22 generates a digital feedback signal, these signals being utilized by the servo system in a manner hereinafter explained.

The hand feed adjustment/internal feed adjustment control device 12, hereinafter designated HFA/IFA, is similar to that shown and described in detail in U.S. Pat. No. 3,417,303, and produces a pulse frequency output ±F representative of the desired velocity of the slide 10. The pulses ±F are equal in magnitude and duration to the pulses derived from the quantizer 22. In a typical case, the HFA/IFA 12 would produce a pulse frequency of 10,000 pulses per minute for a slide velocity of 1 inch per minute. The plus or minus F pulses generated from the HFA/IFA control device 12 are applied to an instantaneous command register (ICM) 26. The ICM 26 is incremented by plus F pulses, and decremented by minus F pulses. Plus and minus quantizer pulses are applied to a position register 28 to respectively increment and decrement the position register. The number in the instantaneous command register 26 indicates the commanded position of the slide 10, and the number in the position register 28 indicates the actual position of the slide 10. In this regard, the position register 28 is of the absolute type in that it always indicates the actual position of the controlled member (slide 10) from a reference point, whereas the instantaneous command register 26 is of the absolute sense in that it always indicates the instantaneous commanded position of the slide 10 with respect to a reference point. The numerical contents of the ICM 26 and the position register 28 are applied to a lag subtractor 30 which subtracts the actual numerical position, as derived from the position register 28, from the instantaneous commanded position in ICM 26. Before the numerical contents of registers 26 and 28 are applied to the lag subtractor 30, a sign predictor network (not shown) samples the signs of the numerical positions in registers 26 and 28 and signifies the resultant sign of the subtraction effected by the lag subtractor 30 to a decomplementer which receives the output of the lag subtractor 30. When the difference between the commanded and actual instantaneous positions, as computed by the lag subtractor 30, is negative, it will be in complemented form, and this is the reason a decomplementer is needed. The resultant lag or position error, which may or may not be decomplemented, is applied to a lag number to frequency converter 32 which generates a pulse frequency ±L proportional to the lag or position error as determined by the lag subtractor 30. The circuitry employed in the ICM 26, the position register 28, the lag subtractor 30, and the lag number to frequency converter 32, along with the details of their operative relationship, are shown in more detail in FIG. 12 of U.S. Pat. No. 3,555,392, and also U.S. Pat. No. 3,538,315. Since a detailed description of the aforementioned elements is not essential to an understanding of the present invention, they will not be herein described in detail.

The L pulses from the lag number to frequency converter 32 enter a summing junction 34 which generates an output pulse frequency designated SRPI (Servo Register Pulse Input). The summing junction 34 also receives certain limiting inputs to control the output (SRPI), as is discussed hereinafter. The pulse frequency SRPI, which may be considered an error frequency, is directed to a high resolution digital to analog converter, generally shown at 36, which produces an analog signal in the form of a voltage proportional to the SRPI pulse frequency input. The high resolution digital to analog converter 36 is constituted by a logic circuit 38 and a seven bit digital to analog converter 40, the analog signal output being generated by the seven bit digital to analog converter 40.

Returning now to the motor 20, motor control is obtained by a three-phase SCR (silicon controlled rectifier) drive circuit. The SCR is the principal component around which the drive circuit is designed. With the SCR subjected to a forward voltage (plus to anode, minus to cathode) the application of a positive pulse to the gate thereof immediately switches the SCR to a conductive state (the SCR is then said to fire). The gate then loses control and the SCR continues to conduct as long as the forward voltage is applied. With a sign wave applied to the SCR, the point on the forward voltage half-cycle at which conduction begins is dependent upon the time the gate pulse is applied. The SCR closes conduction when the forward voltage reaches zero and remains in a non-conductive state during the reverse voltage half-cycle. The conduction time of each half-cycle (which is a maximum of 180°) is commonly referred to as the conduction angle or firing angle and is expressed in degrees. The SCR firing circuit 42 comprises circuitry which controls the gate pulses to allow firing angles from zero to 150°. By controlling the conduction angle, the armature current in the DC motor, and hence the motor speed, may be varied.

The SCR firing circuit 42 receives, as an input, the output from a DC drive amplifier 44. The voltage applied to the SCR firing circuit 42 by the DC drive amplifier 44 is determinative of the firing angle of the SCR's in the circuit 42. The DC drive amplifier 44 receives a speed reference voltage, as amplified, generated by the seven bit digital to analog converter 40 and also the output voltage generated by the tachometer 24. The commanded direction of slide motion determines the polarity of the speed reference voltage from the high resolution digital to analog converter 36, and the tachometer voltage, which is always of opposite polarity to the speed reference voltage, is dependent upon the direction and rate of rotation of the shaft of DC motor 20. The DC drive amplifier 44 produces a DC voltage proportional to the magnitude of the difference between the speed reference voltage and tachometer voltage, this difference having a polarity similar to that of the speed reference voltage.

The DC drive amplifier 44 is capable of generating a maximum voltage, for example, ± 14 volts, and a lesser voltage, for example, ± 8 volts, produces maximum firing angles. It is thus necessary to provide a means for preventing the output of the amplifier from exceeding plus or minus 8 volts. A DC amplifier saturation circuit 46 senses the output of the DC drive amplifier 44 and is adapted to deliver saturation signal DC drive sat+ when plus (+) 8 volts is exceeded. The signals DC drive sat± is delivered to the summing junction 34 in a manner, hereinafter explained, to inhibit an increased pulse frequency (SRPI) from being delivered to the high resolution digital to analog converter, thereby preventing the speed reference voltage from the seven bit digital to analog converter 40 from increasing in a positive sense. When 8 volts minus is exceeded, DC sat− senses and prevents any decrease in SRPI pulse frequency, and thereby any decrease in the seven bit DA output. As the speed of the motor 20 increases or decreases, the tachometer output will correspondingly increase or decrease, thereby forcing the DC drive amplifier out of saturation and terminating the DC drive sat+ or DC drive sat− signals from the DC amplifier saturation circuit 46. As is discussed hereinafter, the high resolution digital to analog converter logic circuit 38 embodies a counter which must be protected from overflow or underflow when operating at its limits. Hence, DA saturation minus (DA sat−) and DA saturation plus (DA sat+) signals are delivered from the high resolution digital to analog converter logic circuit 38 to the summing junction 34. To prevent an increase in the pulse frequency SRPI, as will be explained hereinafter, ±L pulses from the lag number to frequency converter 32 are blocked in the summing junction 34. However, quantizer pulses, which drive this counter away from its limits, are allowed to pass in an unrestricted manner through the summing junction 34.

Another limiting feature of the servo system of FIG. 1 may be found in a null circuit 48 which is operatively connected to the SCR firing circuit 42 to detect if the DC drive is properly balanced for the null case, and also to detect a failure of an SCR to fire. Null circuit 48 is operative only during the time when the starters are down so that, in brief, its function is to insure proper balance between forward and reverse SCR's before a motion is called for, thereby to eliminate any sudden lurching of the slide 10 the moment the motor starter is energized. The SCR firing circuit 42 is adjusted in such a manner that with a zero speed reference voltage input thereto, the output of the null circuit 48 is a square wave with equal on and off times. The output can be considered null plus pulses (null +) and null minus pulses (null−). Equal numbers of null+ pulses and null− pulses are gated to the summing junction 34 during the high and low states of the square wave. Should the null circuit detect an imbalance between the forward and reverse SCRs, the square wave generated by the null circuit will become asymmetrical thereby causing a change in the output pulse frequency SRPI of the summing junction 34 which will tend to restore balance between the forward and reverse SCRs, thereby driving the assymmetrical square wave back to a symmetrical form. A symmetrical square wave from null circuit 48 will result in an equal number of null+ pulses and null− pulses being delivered to summing junction 34, thereby leaving unaffected the SRPI pulse frequency.

Figure 6:
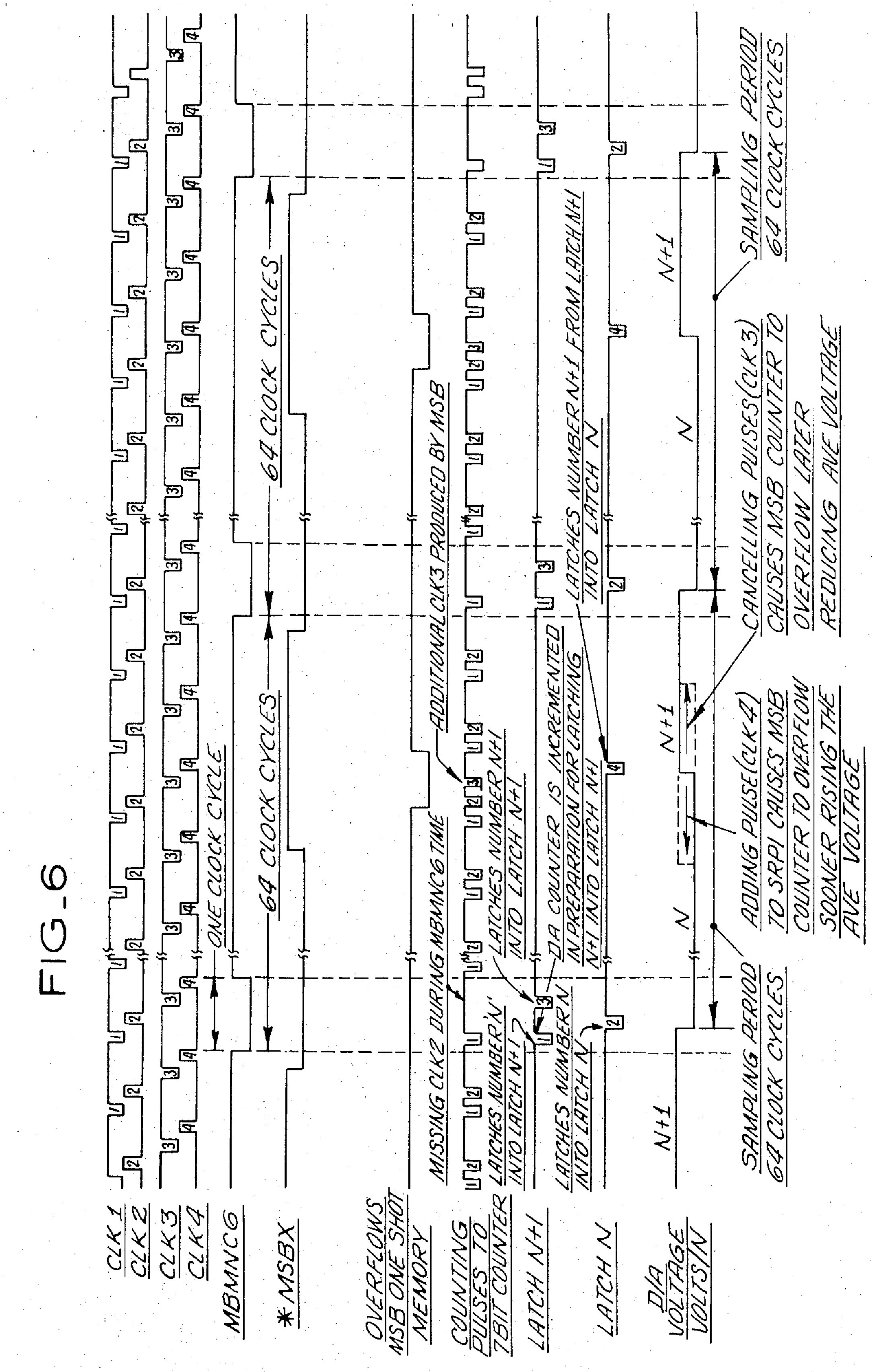
FIG. 6 is a timing diagram for the high resolution digital to analog converter of FIG. 1.

The clock system for the control, which is partially illustrated in FIG. 1, enables the control to function in a synchronized manner. Operations, such as the setting of memories and gating of signals to achieve shifting in registers, must occur at specific times in order for the control to perform correctly. A crystal controlled oscillator 50 feeds a clock oscillator 52 which furnishes four clock signals or pulses in succession, clk 1, clk 2, clk 3 and clk 4, each clock cycle, as hereinafter shown on FIG. 6. The clock pulses clk 1, clk 2, clk 3 and clk 4 have a uniform time relation, as is illustrated in FIG. 6. The clock signals are utilized to generate other timing signals, as discussed in U.S. Pat. No. 3,538,315, for the system of FIG. 1. One of these other signals is a master binary multiplier non-carry pulse, designated MBMNC6. By definition, the clock signals Clk 1 and Clk 3 are logical "one" going or setting pulses, and clock signals Clk 2 and Clk 4 are logical "zero" going or gating pulses.

The servo system of FIG. 1 also includes a synchronizer 54 which is adapted to synchronize the quantizer output to the timing signals generated by the clock oscillator 52. Hence, it will be noted that the quantizer pulses are synchronized before being applied to the summing junction 34 and position register 28.

Before a detailed discussion of the high resolution digital to analog converter of the invention, it should be noted that the disclosed circuit elements are merely presented by way of example, and that they may be subject to variation and substitution without departing from the principles of the invention. For example, in the illustrated embodiment, negative logic is utilized, whereas positive logic would also be acceptable. Furthermore, the logic elements are disclosed as electrical components, and it will be understood that fluidic devices would function in a similar manner.

With regard to notation, an asterisk * means the inverse of the signal to which it applies. For example, a Clk 3 pulse is a logical 1 by definition. Hence, *Clk 3 is a logical 0. Similarly, *Clk 4 would be a logical 1 since Clk 4 is a logical 0. In order not to unduly complicate the drawings with numerous inverters or inversion gates, the asterisk is utilized.

The NOR gates and NAND gates illustrated in the drawings may be constituted by circuits as shown in U.S. Pat. No. 3,417,303. Also, the memory units or flip-flops may be constituted by NOR elements, as shown in U.S. Pat. No. 3,417,303, to provide bistable memory devices. When the inputs to the NOR gates, as illustrated herein, are constituted by a logical 0 and a logical 0, the output of the NOR gate will be a logical 1; when the inputs are constituted by a logical 0 and a logical 1, or by a logical 1 and a logical 1, the output will be a logical 0. When the inputs to a NAND gate are constituted by a logical 1 and a logical 1, the output will be a logical 0; when the input to a NAND gate is constituted by a logical 1 and a logical 0, the output will be a logical 1; and when the input is constituted by a logical 0 and a logical 0, the output will be a logical 1. As to the memory units or flip-flops 96, 100, shown herein, these units will be considered set when their output signals *MSB and *one shot are at a logic 0, and considered reset when their outputs are at logic 1. When the set inputs to the memories 96, 100, the output of NORs 94 and 98, respectively, are at logic 1, and the reset inputs are at logic 0, the memories will flip to the set condition. Reversing the senses of the set and reset inputs will flip the memory to the reset condition. Removing the set or reset signals, both set and reset a logic 0, the memory will remain in its last programmed condition.

Figure 2:
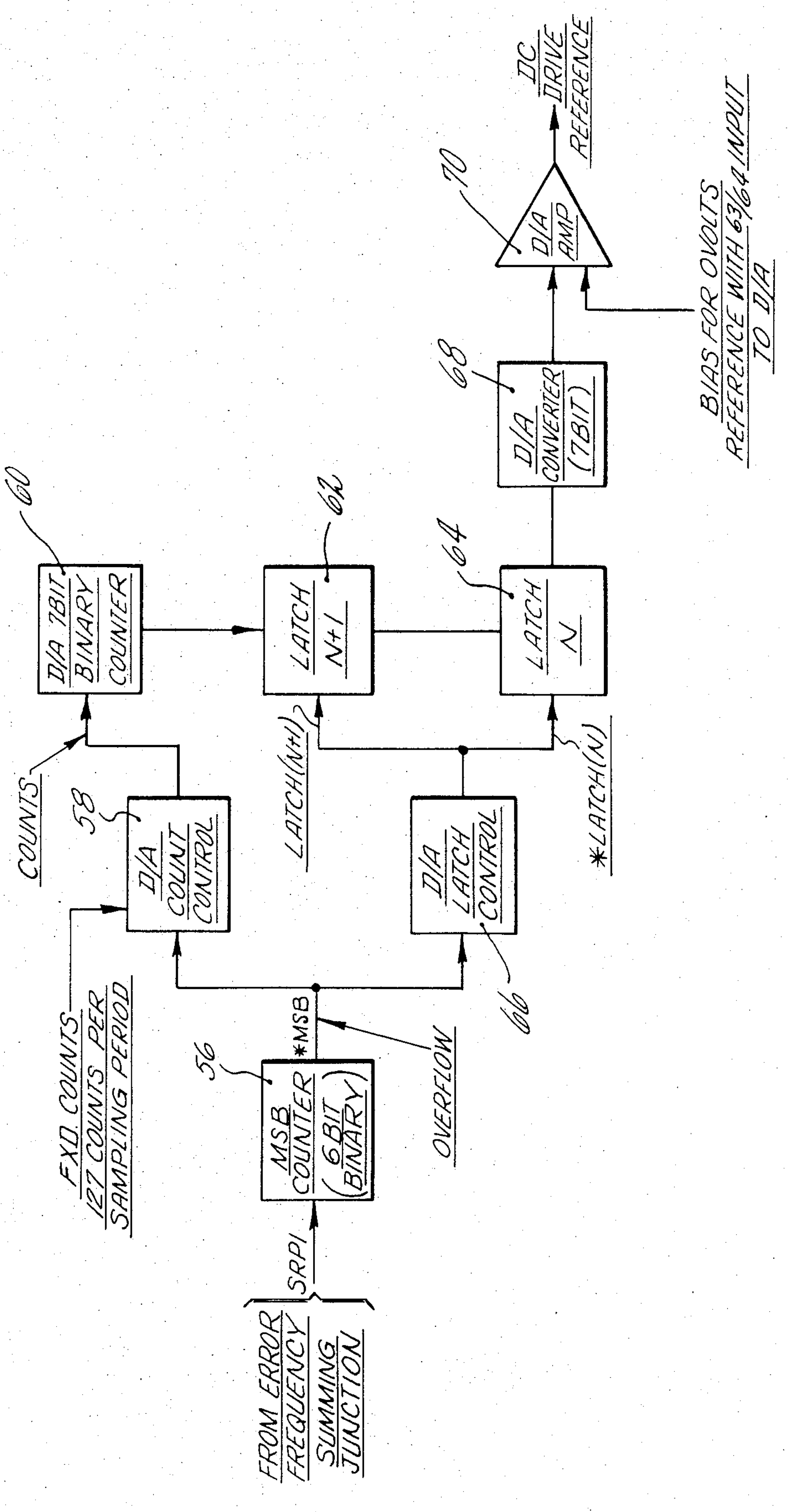
FIG. 2 is a block diagram of the high resolution digital to analog converter of FIG. 1.

Turning now to FIG. 2, the pulse error frequency from the summing junction (SRPI) is applied to a most significant bit or MSB counter 56, which is a six bit binary overflow counter. Under steady-state conditions, that is, when the slide 10 is moving at a constant velocity, the SRPI pulse frequency is a fixed *Clk 3 signal. The output of the MSB counter 56, designated *MSB, is directed to a one shot (shown in FIG. 4A) which generates a pulse *MSB indicating that the counter has overflowed.

Referring to FIG. 6, and assuming that the DC motor starter is engaged and with no motion being commanded, the SRPI pulse frequency is a fixed *Clk 3, and therefore the MSB counter 56 overflows every 64 *Clk 3 pulses, or every 64 clock cycles, thereby maintaining a fixed relationship to the sampling time signal MBMNC6. Obviously, adding pulses to SRPI causes the MSB counter 56 to overflow earlier, while cancelling pulses from the SRPI causes the MSB counter to overflow later.

The *MSB pulse from the one shot is directed to a D/A count control circuit 58 which receives 127 fixed counts per sampling period (64 clock cycles), as defined by the signal MBMNC6. The count control circuit 58 counts every MSB pulse, every Clk 1 pulse, and every Clk 2 pulse, with the exception of the Clk 2 pulse occurring during the MBMNC6 signal. The count control circuit 58 directs these pulses to a seven bit binary overflow counter 60. The counter 60 returns to the same number during sampling period. (127 fixed counts plus the steady MSB count, which is fixed in time when no input disturbance is applied, overflows the counter and returns it to the same count during the sampling period.

Two storage devices or latches 62 and 64, respectively, designated latch N+1 and latch N, are adapted to store the contents of the seven bit binary counter 60 as sampled at a predetermined time. Specifically and with reference to FIG. 6, at the leading edge of the Clk 1 pulse occurring during the MBMNC6 pulse, the number N, presently existing in the seven bit binary counter 60, is latched into latch N+1 62 by means of a D/A latch control circuit 66. At the trailing edge of this Clk 1 pulse, the counter 60 is incremented by one. The number which is in latch N 64 is the input to a conventional seven bit digital to analog converter 68. At the leading edge of the immediately succeeding Clk 2 pulse, the contents of latch N+1 (the number N) are latched into latch N 64. At the leading edge of the immediately succeeding Clk 3 pulse, the number in the counter 60 (N+1) is latched into latch N+1 62. At this time, latch N+1 62 contains the number N+1, and latch N 64 contains the number N. It will be noted that the operations performed by the latch control 66 during the pulses Clk 1, Clk 2 and Clk 3 occur during a MBMNC6 pulse. When the MSB counter 56 overflows, as indicated by an MSB pulse, the stored contents of latch N+1, which is a number one greater than the stored contents of latch N, are now latched into latch N (thereby increasing its contents by 1) at the leading edge of a Clk 4 pulse coinciding therewith. Hence, the number now applied to the digital to analog converter 68 is increased by one.

It should be apparent that the average voltage delivered by the digital to analog converter 68 is dependent upon the relative times (i.e., the number of clock cycles) during which the number N and the number N+1 are applied thereto. The average voltage output of the seven bit digital to analog converter 68 can be expressed by the equation:

$$Vout = V_n + \Delta V[([64-M)/64]$$

wherein:

$Vout$ is average voltage output;

$V_n$ is voltage output produced by the number N;

$M$ is the number of clock cycles during which the latch N 64 contains the number N;

$\Delta V$ is the voltage output per unit bit of the digital to analog converter 68.

Hence, it will be noted that the voltage output of the digital to analog converter 68, during a sampling period which is 64 clock cycles in length, is determined by the number of clock cycles required for the MSB counter 56 to overflow, if, in fact, it does overflow, this in turn being determined by the error pulse frequency input SRPI.

If the MSB counter overflows twice within one sampling period, the number in the seven bit digital to analog converter will increase by one bit in successive sampling periods; if no MSB counter overflows occur during a sampling period, the output of the seven bit digital to analog converter will decrease by one bit in successive sampling periods. One overflow per sampling period will cause no change in the output of the seven bit D/A converter. During the Clk 1 pulse of MBMNC6, the number N, which is in the counter 60, varies between zero and 127. Hence, the number N, latched into latch N+1 at this Clk 1 pulse, may accordingly vary between zero and 127. Hence, the voltage range of the digital to analog converter 68 embraces 64 × 128, or 8,192 different values. Ordinarily number of voltage magnitudes obtainable from a seven bit digital to analog converter would number only 128. Hence, it will be seen that the logic circuit 38 significantly increases the resolution of a digital to analog converter. The output of the converter 68 is applied to an amplifier 70 which applies a DC drive reference voltage to the DC drive amplifier 44 of FIG. 1. The amplifier 70 is biased to generate a zero volt reference when the input to the digital to analog converter 68 is intermediate 63 and 64. This is because the number in the seven bit binary counter 60 will be 63 with the DC motor starter down at the Clk 1 pulse during the MBMNC6 pulse, the number 63 being latched into latch N+1 during this time, as previously explained.

Figure 3:
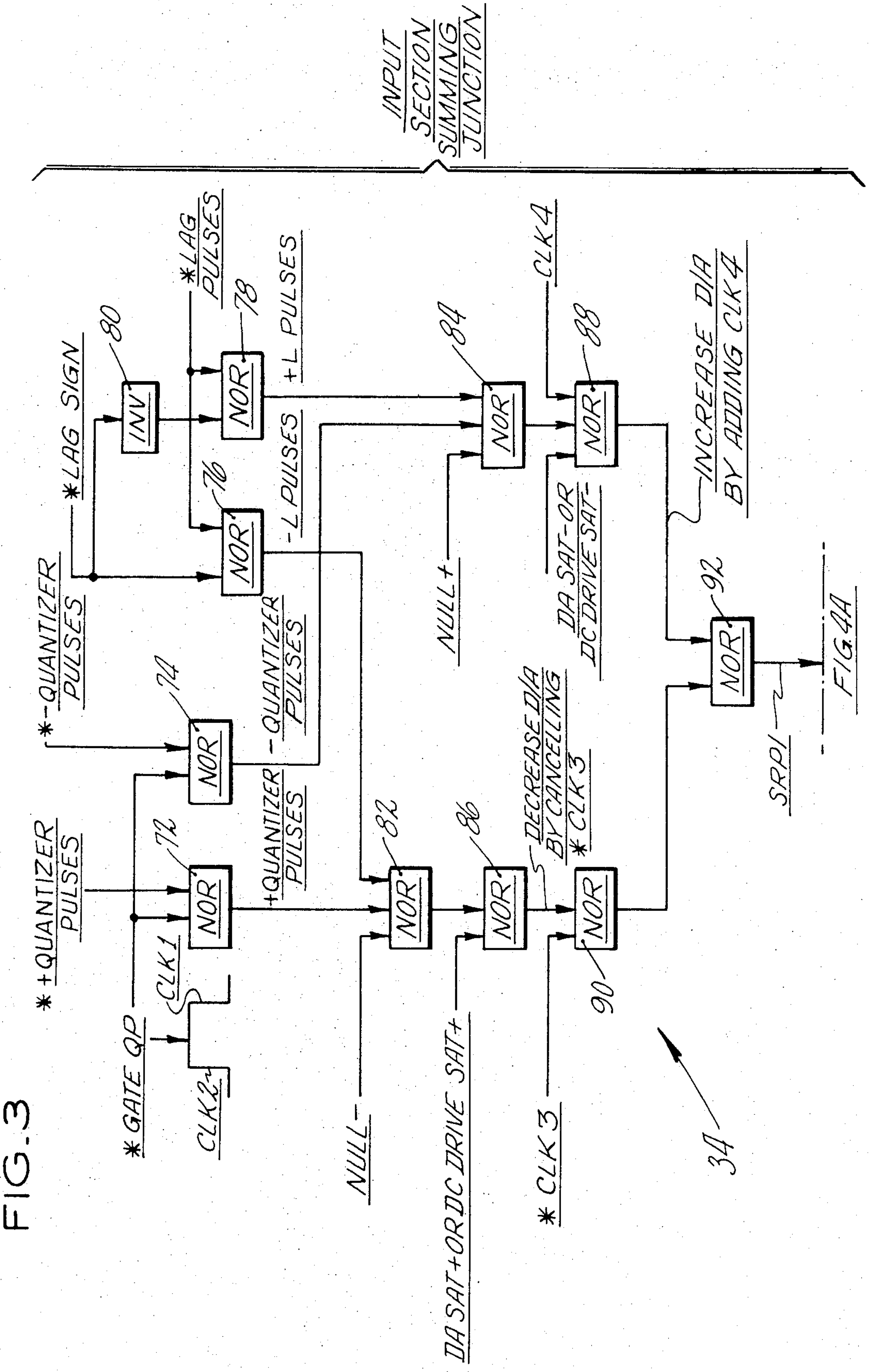
FIG. 3 is a schematic diagram of the input summing junction of FIG. 1.

FIG. 3 shows the details of the summing junction 34 of FIG. 1. The false sense of the plus and minus quantizer pulses are gated through NOR gates 72 and 74 by the signal * gate QP pulse. The lag pulses (* lag pulses) are gated through NOR gates 76 and 78. The signal * lag sign is applied to gate 76 and its inverted sense, lag sign, is applied to gate 78 via the inverter 80. Hence, NOR gate 76 passes minus lag (−L) pulses and NOR gate 78 passes plus lag (+L) pulses minus L pulses (−L) or negative null pulses (Null−) from the null circuit 48 or positive (+) quantizer pulses, each lasting from CLK 2 to the following CLK 1 applied to NOR gate 82 present a logic 0 to NOR 86. If the signal DASAT+ DC drive sat+ applied to the second input of NOR 86 is a logic 0, a logic 1 is presented to input two of NOR gate 90 thus cancelling a CLK 3. Similarly plus L pulses (+L) or positive Null pulses (Null+) from the Null circuit 4B, or negative (−) quantizer pulses, all lasting from CLK 2 to the following CLK 1, applied to NOR 84 present a logic 0 to NOR 88. If the signal DASAT− + DC drive sat− applied to the second input of NOR 88 is a logic 0 then the CLK 4 which is a logic 0 going clock will present a logic 1, * CLK 4, to NOR 91 (Inserts a CLK 4 in SRPI output, designated * MSB and shown in FIG. 6). The MSB one shot 93 is comprises of two flip-flops or memories 96 and 100. When * MSBX is in logic 1 state memory 100 is reset as is the memory 96 (*MSB and *one shot are both logic 1's). The first CLK 2 pulse after the occurrence of *MSBX going to logic 0 sets memory 96. Memory 96 remains set from CLK 2 to the following CLK 1. The aforementioned pulse, * MSB, is directed to one input of NOR 98. A CLK 4 is directed to the other input. The * CLK 4 output of NOR 98 sets memory 100. The output of memory 100 blocks any further CLK 2 pulses from setting memory 96 (blocks NOR 94). Memory 100 is reset when * MSBX goes to logic 1. The MSB one shot is then ready to accept the next logic 0 state of * MSBX.

Figure 4A:
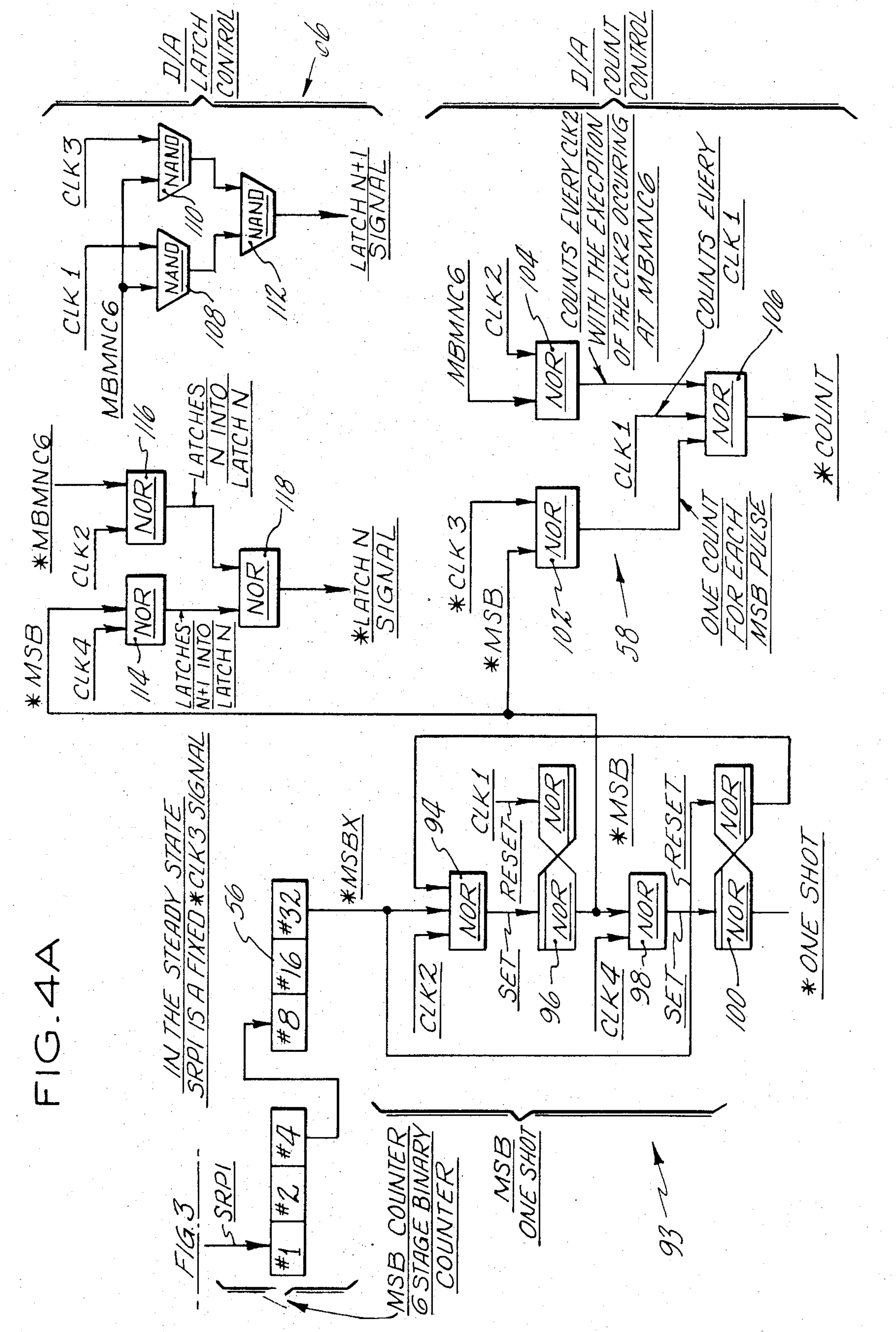
FIG. 4 A is a portion of the logic diagram of the high resolution digital to analog converter of FIG. 1.

The * MSB pulse is also applied to the count control circuit 58 shown in detail in FIG. 4A. The * MSB pulse from the one shot memory 93 is applied to a NOR gate 102 along with the * CLK 3 signal pulses. Hence, NOR gate 102 will supply one count for each * MSB pulse. The count control circuit 58 also includes another NOR gate 104 having as its input the signal MBMNC6 and CLK 2 pulses. Hence, the output of NOR gate 104 goes to logic 1 every CLK 2 pulse with the exception of the CLK 2 pulse occurring during the signal MBMNC6. The outputs of NOR gates 102 and 104 are applied to a third NOR gate 106, which also receives CLK 1 pulses. Hence, the * count supplied by NOR gate 106 includes every CLK 1 pulse, every CLK 2 pulse, save one, and one pulse for each * MSB pulse. The timing diagram of FIG. 6 illustrates the output of NOR gate 106.

Turning now to the latch control circuit 66 (FIG. 4A) which dictates when the counts supplied to the seven bit binary counter 60 by NOR gate 106 will be sampled for latching into latch N+1 62. CLK 1 and CLK 3 pulses are respectively applied to NAND gates 108 and 110 along with the signal MBMNC6. The output of NAND gates 108 and 110 are fed to a third NAND gate 112 which has, as its output, the CLK 1 pulses and CLK 3 pulses occurring at MBMNC6. When the CLK 1 pulse occurring during the signal MBMNC6 is present, the number (N) in the counter 60 will be latched for storage into latch N+1 62. After the counter 60 has been incremented by one on the trailing edge of a CLK 1 pulse occurring during MBMNC6, the number in the counter 60 has increased by one and is subsequently latched into latch N+1 for storage during a CLK 3 pulse. Just previous to latching the number (now N+1) in counter 60 into latch N+1 by the leading edge of this CLK 3 pulse, the contents of latch N+1 (the number N originally derived from the counter at the leading edge of the CLK 1 pulse) are latched into latch N.

With continuing reference to the latch control 66 of FIG. 4A, CLK 4 pulses and the * MSB pulse of the one shot 93 are applied to a NOR gate 114, CLK 2 pulses and the signal * MBMNC6 are applied to another NOR gate 116, the outputs of these NOR gates are respectively determinative of the times when the contents of latch N+1 62 are latched into latch N 64. These signals are applied to a NOR gate 118 which supplies the output signal designated as the * latch N signal. It should be noted that the CLK 4 signal coinciding with the * MSB signal is the signal which determines the length of time (number of clock cycles) during which the respective contents of the storage devices 62 and 64 are applied to the digital to analog converter 68 and hence, the average voltage.

As was previously mentioned the output of the high resolution digital to analog converter 36 is increased by adding CLK 4 pulses to the summing junction 34. The addition of one CLK 4 pulse causes the MSB counter 56 to overflow one clock cycle earlier in time, thereby latching the number N+1 from latch N+1 62 into latch N 64 earlier in time by one clock cycle. The action raises the DC output by the fraction 1/64 times the output per unit of the digital analog converter 68. In the specific system disclosed, it requires 63 additional CLK 4 signals to raise the output by one times the output per unit of the digital analog converter 68. It should be borne in mind that a sampling period extends over 64 clock cycles and thus embodies 64 CLK 4 signals.

Figure 4B:
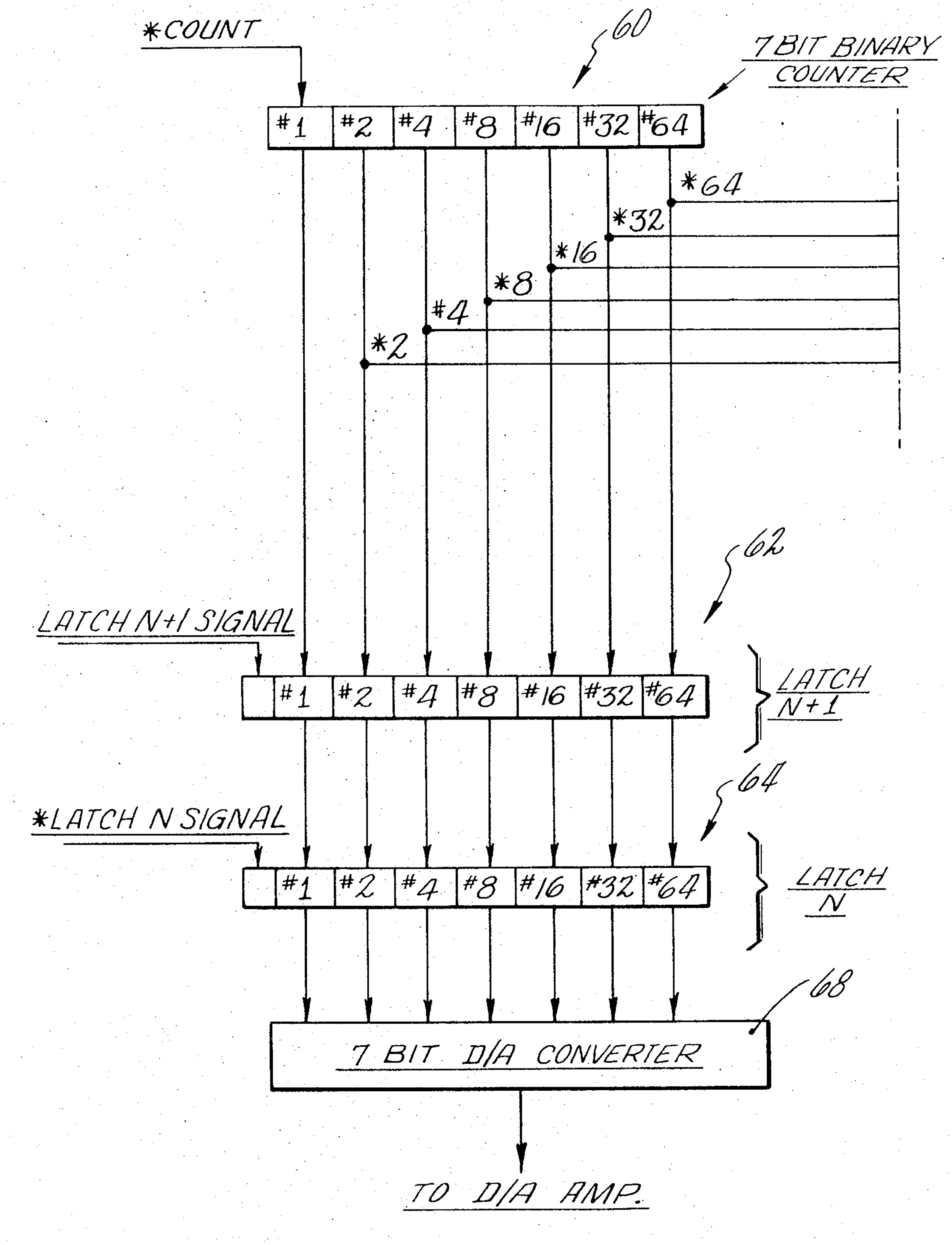

Turning now to FIG. 4B, it will be noted that the stages of the binary counter 60 are directly latched into the corresponding stages of the latch N+1 62 during the signal latch N+1 and that the contents of the stages of latch N+1, which is a seven bit storage register, are latched into latch N 64 during receipt of a * latch N signal. Latch N 64 is also a seven bit storage register and has its stages connected to the seven bit digital analog converter 68.

Figure 5:
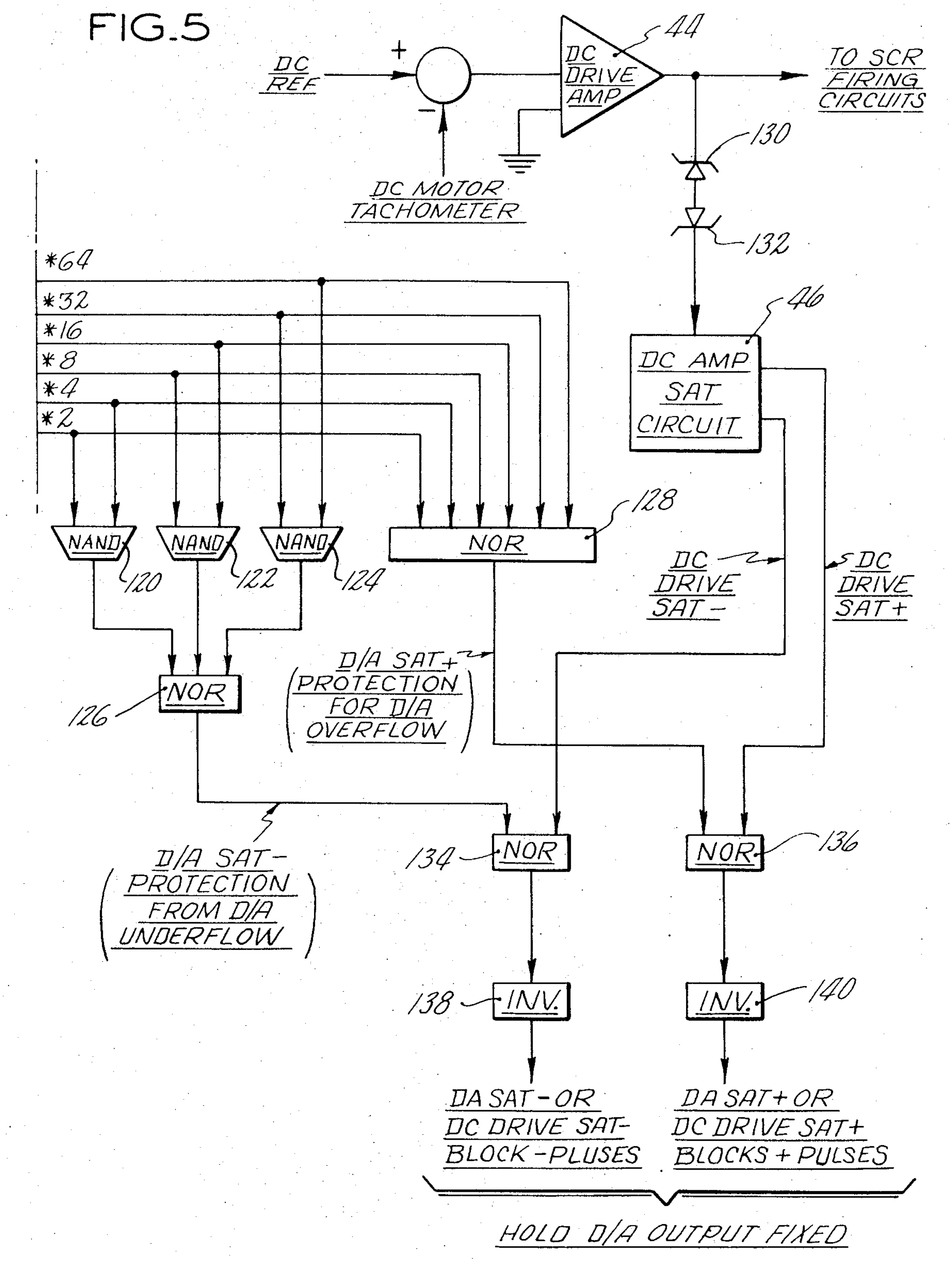
FIG. 5 is a schematic diagram of the saturation circuit of FIG. 1.

The stages of the seven bit binary counter 60 are also connected to NAND gates 120, 122, and 124, the second and third stages being connected to NAND gate 120, the fourth and fifth stages being connected to NAND gate 122, and the sixth and seven stages being connected to NAND gate 124. When the second, third, fourth, fifth, sixth, and seventh stages all are empty, a NOR gate 126 will provide the D/A sat − signal to protect a counter 60 from underflow. The same stages are also connected to the NOR gate 128 which generates the D/A sat + signal when the stages are full for protection against overflow of counter 60. As also shown in FIG. 5, the DC drive amplifier 44, which supplies the voltage to the SCR firing circuits, has its output connected to two back to back, series connected zener diodes 130 and 132. When the DC drive amplifier 44 delivers + 8 volts, one of the zener diodes acts as a conventional diode and the other as a zener diode. When the DC drive amplifier 44 delivers − 8 volts, the zener diode, which acted as a conventional diode for the + 8 volts output, now acts as a zener diode, and the other zener diode acts as a conventional diode. The voltage signal from the zener diodes 130 and 132 is applied to the DC amplifier saturation circuit 46 which generates the signals DC drive sat − and DC drive sat +, these DC signals being respectively applied to NOR gates 134 and 136 which respectively receive the D/A sat − signal from NOR gate 126 and the D/A sat + signal from NOR gate 128.

The output signals of NOR gates 134 and 136 are respectively applied to gates 138 and 140 which in turn generate D/A sat − or DC drive sat + signals. The positive signals are adapted to block positive pulses and the negative signals are adapted to block negative pulses, thereby to hold fixed the output of the high resolution digital analog converter.

To recapitulate briefly it is necessary to prevent underflow or overflow. Overflow occurs when the count increasing CLK 4 pulses received at the summing junction 34 drive the counter 60 above 127; underflow occurs when cancelling the * CLK 3 pulses tends to count the counter 60 below 0. An overflow would change the count in the counter 60 from 127 to 0 and this would reverse the motor and drive the motor at full reverse voltage. An underflow would drive the count of 0 to 127 in a similar fashion. Hence, when the counter 60 nears its capacity (e.g., when all bits in the counter are in the logic 0 state), the number 126 in the counter is decoded by the illustrated circuitry to provide a signal for overflow protection. In like manner, the number one in counter 60 is decoded by the illustrated circuitry to sense proximity to underflow and a signal generated for protection from underflow.

We claim:

1. a high resolution digital to analog converter comprising:

- a first counter circuit for receiving digital input signals and for periodically generating an overflow signal after a predetermined number of digital signals have been received;
- a clock for generating a plurality of timing pulses;
- a predetermined number of clock cycles defining a sampling period;
- a count control circuit operatively connected to the first counter circuit and the clock for receiving a fixed number of timing pulses from the clock during the sampling period and the overflow signal from the first counter and generating a count for every each of the fixed number of timing pulses and the overflow signal;
- a second counter operatively connected to the count control circuit for receiving counts from the count control circuit;
- a first storage device for retaining a number derived from the counter at a predetermined time in the sampling period;
- a second storage device for retaining the number derived from the counter as incremented by a fixed number;
- a digital to analog converter adapted to convert a digital signal to an analog signal; and
- a latch control circuit operatively connected to the first counter and the first and second storage devices for selectively applying the respective number in the storage devices to the digital to analog converter in accordance with the occurrence of the overflow signal to thereby vary the average analog signal with the rate of reception of the digital input signals.

2. a high resolution digital to analog converter adapted to receive digital input signals comprising:

- a digital to analog converter to convert a digital signal to an analog signal;
- first counting means to count the input signals and generate a signal after a predetermined number of input signals have been counted;
- means to generate a timing signal to define a sampling period;
- second counting means to count a predetermined number of signals in the sampling period and the signal from the first means;
- first storage means to store a count derived from said second counting means at a fixed time in the sampling period;
- second storage means to store the count stored by the first storage means plus a fixed number and means responsive to the signal generated by the first counting means to selectively apply the respective counts stored in the first storage means and the second storage means to the digital to analog converter.

3. The converter of claim 2, further including:

- latch control means to latch the count in the second counting means into the first storage means, to subsequently latch the count in the first storage means into the second storage means, to subsequently latch an incremented count in the counting means into the first storage means, and to subsequently latch the count in the first storage means into the second storage means.

4. The converter of claim 2, wherein the first counting means comprises:

- a binary counter; and
- a one-shot operatively connected to the counter.

* * * * *